United States Patent [19]

Matsuzawa et al.

[11] Patent Number: 4,963,874
[45] Date of Patent: Oct. 16, 1990

[54] PARALLEL TYPE A/D CONVERTER

[75] Inventors: Akira Matsuzawa, Neyagawa; Haruyasu Yamada, Hirakata, both of Japan

[73] Assignee: Matsushita Electric Industrial Co., Ltd., Osaka, Japan

[21] Appl. No.: 187,642

[22] Filed: Apr. 28, 1988

[30] Foreign Application Priority Data

Apr. 28, 1987 [JP] Japan .................. 62-105138
Nov. 4, 1987 [JP] Japan .................. 62-278617

[51] Int. Cl.$^5$ .................. H03M 1/00
[52] U.S. Cl. .................. 341/159; 341/96; 341/155
[58] Field of Search .................. 341/97, 98, 96, 155, 341/159, 160

[56] References Cited

U.S. PATENT DOCUMENTS

| | | | |
|---|---|---|---|
| 3,585,631 | 6/1971 | McCown | 341/159 |
| 4,386,339 | 5/1983 | Henry et al. | 341/159 |
| 4,596,978 | 6/1986 | Fujita | 341/97 |
| 4,599,599 | 7/1986 | Sekino et al. | 341/160 |
| 4,644,322 | 2/1987 | Fujita | 341/96 |

FOREIGN PATENT DOCUMENTS

| | | | |
|---|---|---|---|
| 0135290 | 3/1985 | European Pat. Off. | 341/97 |
| 0034645 | 10/1971 | Japan | 341/97 |
| 0062627 | 4/1982 | Japan | 341/159 |
| 0095621 | 5/1986 | Japan | 341/159 |

*Primary Examiner*—William M. Shoop, Jr.
*Assistant Examiner*—Helen Kim
*Attorney, Agent, or Firm*—Wenderoth, Lind & Ponack

[57] ABSTRACT

A parallel type A/D converter includes circuitry for generating plural reference voltages, comparators for comparing the plural reference voltages with an input voltage, logic circuits for logically processing the outputs of comparators, and an encoder circuit for encoding the outputs from the logic circuits. A pair of logic outputs are obtained by a first logic circuit chain for receiving as inputs the outputs of a comparator of number i and of a comparator i+2. Conversion errors are reduced by properly processing this pair of logic outputs in a second logic circuit, or by composing an encoder circuit for receiving the pair of logic outputs as inputs.

10 Claims, 8 Drawing Sheets

FIG. 4A
|      | A | B | Q |
|------|---|---|---|
| L(i) | 0 | 0 | 0 |
| L(i-1) | 1 | 0 | 1 |
| L(i-2) | 1 | 1 | 0 |
$Q = A \cdot \overline{B}$
FIG. 4B
|      | A | B | Q |
|------|---|---|---|
| L(i) | 1* | 0 | 1 |
| L(i-1) | 1 | 0* | 1 |
| L(i-2) | 1 | 1 | 0 |
⌈0*⌉ : WEAK ⌈0⌉
⌈1*⌉ : WEAK ⌈1⌉
FIG. 4C
|      | A | B | Q |
|------|---|---|---|
| L(i) | 0* | 0 | 0 |
| L(i-1) | 1 | 1* | 0 |
| L(i-2) | 1 | 1 | 0 |
FIG. 11A
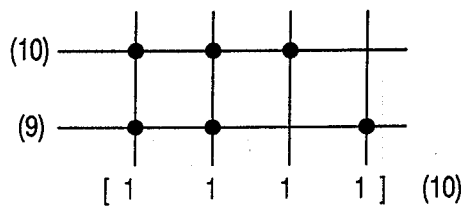
FIG. 11B
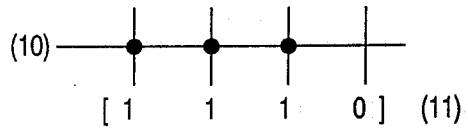
FIG. 11C
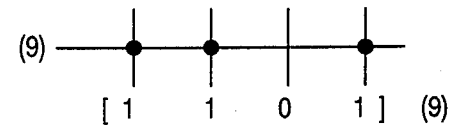
FIG. 11D
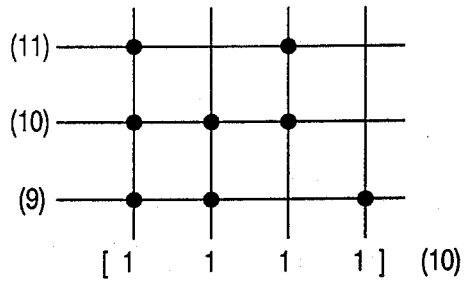
FIG. 11E
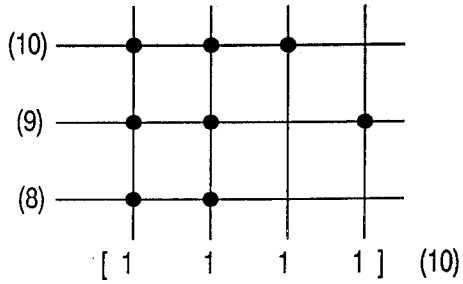

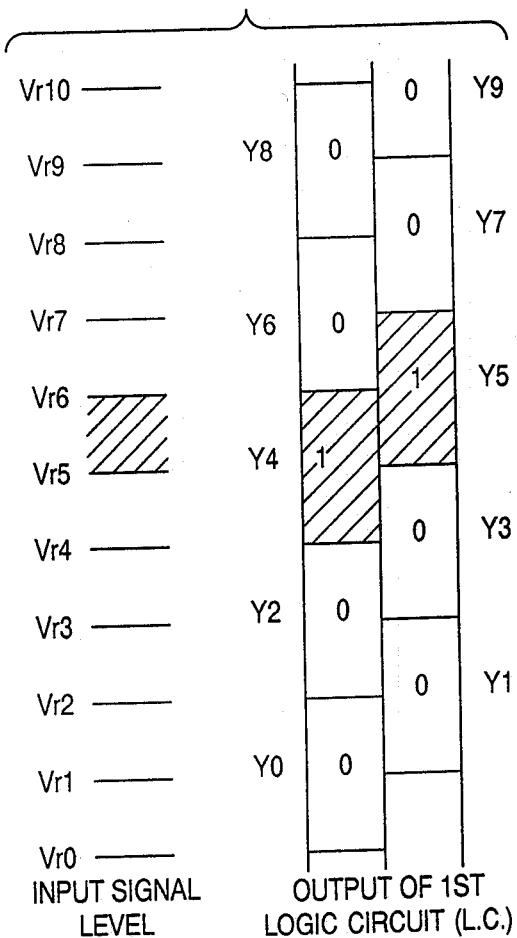

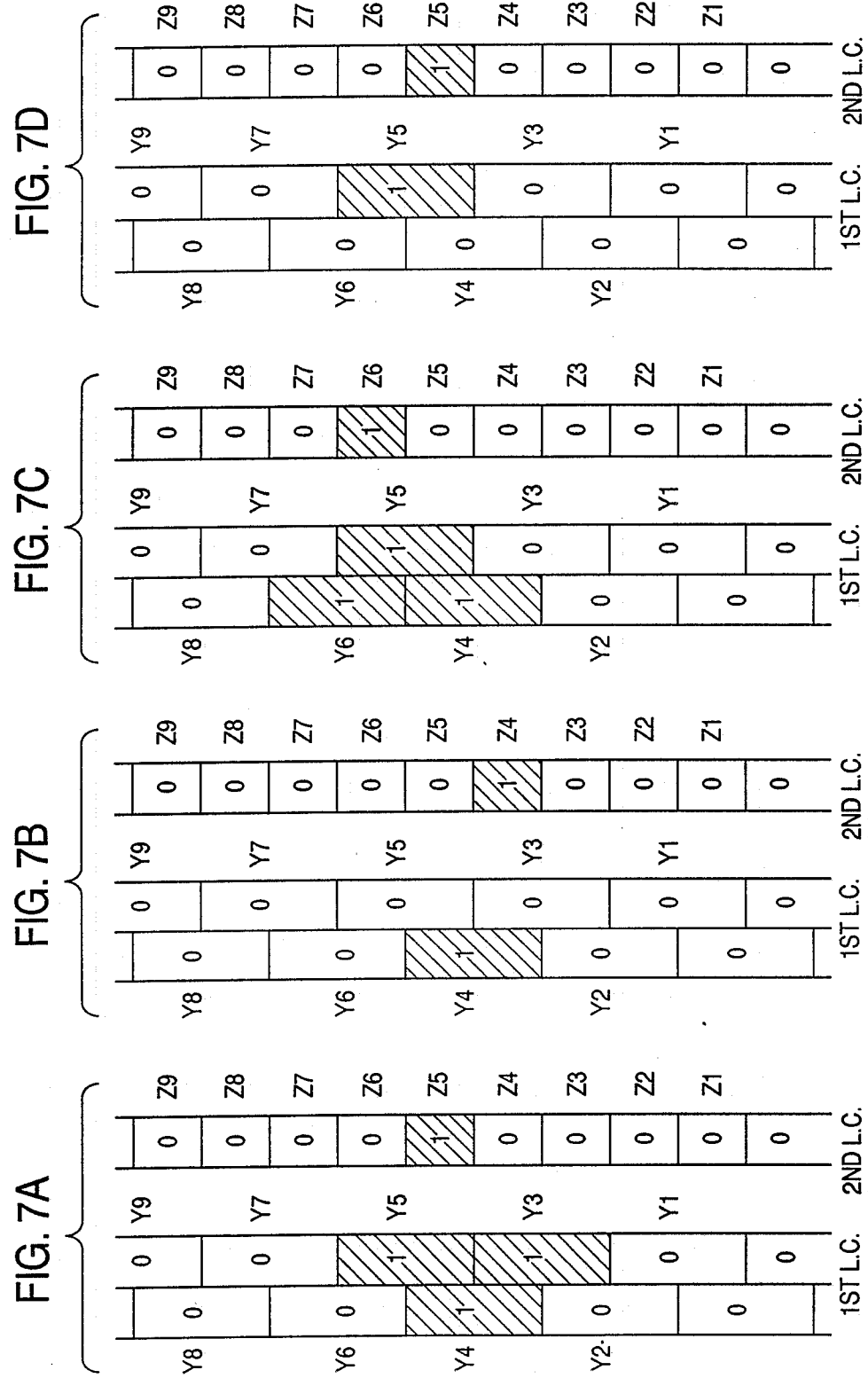

FIG. 10

| A=INPUT NO. | B=NORMAL GRAY CODE (Upper Bits / LSB) | | | | C=INTERMEDIATE CODE | | | | D=CODE OF THIS INVENTION | | | |
|---|---|---|---|---|---|---|---|---|---|---|---|---|
| 15 | 1 | 0 | 0 | 0 | 0 | 0 | 0 | 0 | | | | |
| 14 | 1 | 0 | 0 | 1 | 1 | 0 | 0 | 0 | 1 | 0 | 0 | 0 |
| 13 | 1 | 0 | 1 | 1 | 0 | 0 | 0 | 1 | 1 | 0 | 0 | 1 |
| 12 | 1 | 0 | 1 | 0 | 1 | 0 | 1 | 0 | 1 | 0 | 1 | 0 |
| 11 | 1 | 1 | 1 | 0 | 0 | 0 | 0 | 0 | 1 | 0 | 1 | 0 |
| 10 | 1 | 1 | 1 | 1 | 1 | 1 | 1 | 0 | 1 | 1 | 1 | 0 |
| 9 | 1 | 1 | 0 | 1 | 0 | 0 | 0 | 1 | 1 | 1 | 0 | 1 |
| 8 | 1 | 1 | 0 | 0 | 1 | 1 | 0 | 0 | 1 | 1 | 0 | 0 |
| 7 | 0 | 1 | 0 | 0 | 0 | 0 | 0 | 0 | 0 | 1 | 0 | 0 |
| 6 | 0 | 1 | 0 | 1 | 0 | 1 | 0 | 0 | 0 | 1 | 0 | 0 |
| 5 | 0 | 1 | 1 | 1 | 0 | 0 | 0 | 1 | 0 | 1 | 0 | 1 |
| 4 | 0 | 1 | 1 | 0 | 0 | 1 | 1 | 0 | 0 | 1 | 1 | 0 |
| 3 | 0 | 0 | 1 | 0 | 0 | 0 | 0 | 0 | 0 | 0 | 1 | 0 |
| 2 | 0 | 0 | 1 | 1 | 0 | 0 | 1 | 0 | 0 | 0 | 1 | 0 |
| 1 | 0 | 0 | 0 | 1 | 0 | 0 | 0 | 1 | 0 | 0 | 0 | 1 |
| 0 | 0 | 0 | 0 | 0 | 0 | 0 | 0 | 0 | 0 | 0 | 0 | 0 |

PARALLEL TYPE A/D CONVERTER

BACKGROUND OF THE INVENTION

This invention relates to a parallel type A/D converter capable of converting an analog value into a digital value.

In a conventional parallel type A/D converter, as shown in FIG. 1, an input signal 1 is fed parallel to one input end of each of the comparators which compose the comparator chain 4. A standard voltage 2 is divided by a standard resistor chain 3 composed of resistors R1 to R16, and individual reference voltages Vr1 to Vr15 are thus formed. These reference voltages are respectively and sequentially fed into the other input end b of each of the comparators C1 to C15. The individual comparators C1 to C15 compare the individual reference voltages Vr1 to Vr15 with the input signal 1, and amplify and deliver the results of the comparison to output ends c. The output level of the output ends c is either "1" or "0", depending on whether or not the input signal 1 is higher than the reference voltage inputted at each comparator C1 to C15. Accordingly, logic circuits L1 to L15 composing a logic circuit chain 5, have as inputs non-inverted logic signals from a corresponding comparator and inverted logic signals from an adjacent comparator to obtain an AND of those signals i.e., the logic output of a logic circuit receiving two different input signals becomes "1, " while the logic outputs of the other logic circuits become 0. Accordingly, this logic output is entered into an encoder circuit 6, and only the activated code is selected. Consequently a binary output is delivered to an output end 7, to thereby perform the analog-to-digital conversion effectively.

In such a parallel type A/D converter, when one of the reference voltages Vr1 to VR15 applied to comparators C1 to C15 and the input voltage 1 signal voltage are extremely close to each other, an error is caused, and the reliability of the A/D conversion is extremely impaired.

This problem is explained by referring to diagrams. FIG. 2 shows the input and output characteristics of the comparator circuits. The comparators generate an output voltage having a logic level of 1 when the input signal is higher than the reference voltage, and an output voltage having a logic level of 0 when the input signal is lower than the reference voltage, and also generate a voltage close to the logic threshold value when the input signal is close to the reference voltage. In this condition, due to hysteresis characteristics noise, and the logic level falls into an ambiguous state. FIG. 3 is a logic circuit diagram showing a portion of the conventional parallel type A/D converter shown in FIG. 1. Supposing the input of the logic circuits in the logic circuit chain 5 to be A and the inverted input to be $\bar{B}$, the logic circuit output Q is expressed in a logic formula of $$Q = A \cdot \bar{B} \tag{1}$$

FIG. 4A, 4B, and 4C are logic state diagrams representing the input and output states of these logic circuits, in which i, i−1, i−2 denote the logic circuit numbers. When the input signal 1 is sufficiently higher than the reference voltage Vri−1 of the comparator number i−1 and is lower than the reference voltage Vri of the comparator number i, the logic state becomes as shown in FIG. 4A, and only the logic output Q of the logic circuit number i−1, L(i−1) becomes 0 while other logic outputs are all 0, so that a binary normal converted value is obtained in the encoder circuit 7 shown in FIG. 1. However, when the input signal becomes nearly equal to the reference voltage Vri, the following two errors may occur. FIG. 4B shows a case in which the output signal from the comparator number i is so near the logic threshold value that it is regarded as 0 in the logic circuit number i−1 and as 1 in the logic circuit number i. Consequently, two logic outputs become 1 And an error results in the encoder circuit 6. For example, when the logic circuits number 7 and number 8 generate 1, in the encoder circuit 6, "0111" and "1000" are combined in an OR operation in each bit on the encoder, and "1111" or "15" is delivered, which is a very large error compared to the true value of "7" or "8." In FIG. 4C, contrary to FIG. 4B, the output signal from the comparator number i is regarded as 0 in the logic circuit number i−1, and as 1 in the logic circuit number i, and in this condition all logic outputs are 0, which also results in a significant error.

Thus, the conventional parallel type A/D converter, the intrinsic tendency of creating an error as pointed out in a paper by Bernhard Zojer et al. (A 6-bit/ 200-MHz full nyquist A/D converter, IEEE J. Solid-State Circuits, vol. sc-20, No. 3, pp. 780–786, June 1985).

The relation between this error occurrence probability Pε and the conversion time is expressed as $$P\epsilon = (Va/Vq)\exp(-\tau/\tau) \tag{2}$$

where Va is an input ambiguous voltage of the comparator, Vq is a unit quantization voltage, t is the duration of the strobing mode of the comparator which is usually half the conversion time, and τ is a time constant of the strobe circuit.

Accordingly, in an ordinary parallel type A/D converter, as the conversion rate is increased, the error incidence rate becomes higher, which is thereby creating a bottle-neck for high speed conversion.

SUMMARY OF THE INVENTION

It is hence a primary object of this invention to present a parallel type A/D converter in which errors are hardly ever caused. It is another object of this invention to present a parallel type A/D converter capable of operating at a high speed and at a low power consumption.

To achieve the above objects, this invention presents a parallel type A/D converter which comprises circuitry for generating plural reference voltages, comparators for comparing these reference voltages with an input voltage, and logic circuits for generating an active logic outputs according to the outputs of these comparators. Furthermore, to realize the logic circuits, in the sequence of monotonous increase of said reference voltages with respect to the individual comparators, expressing the sequence of a particular comparator as (i) (not less than 1), and the logic output of an adjacent pair is made active by entering the comparison output of the comparator number i and the comparator number i+2. In addition, supposing the logic circuits to be a first logic circuit chain, there is a second logic circuit chain having a logic composition in which only one logic output is activated by using the positive logic output and negative logic output of the adjacent logic outputs of the first logic circuit chain.

Moreover, provided is a novel encoder circuit capable of generating a specified code with respect to a pair of adjacent inputs, using the logic output of the first logic circuit as the input, instead of the second logic circuit. To realize this encoder, still furthermore, supposing n to be an integer larger than 0, the output of the logic circuit number 2n codes the encoder lives with a Gray code corresponding to 2n except the least significant bit, and the output of the logic circuit number 4n+1 makes active the least significant bit of the encoder circuit, and further the output of the logic circuit number 2n+1 codes so as to obtain the AND of each bit of the coding of number 2n and number 2n+2 on the encoder lines.

In this constitution, a parallel type A/D converter with an extremely low incidence of errors may be realized, which may contribute greatly to the enhancement of reliability of the A/D converters and to an increase in the conversion rate.

While the novel features of the invention are set forth with particularity in the appended claims, the invention, both as to organization and content, will be better understood and appreciated, along with other objects and features thereof, from the following detailed description taken in conjunction with the drawings.

BRIEF DESCRIPTION OF THE DRAWINGS

FIGS. 4A to 4C are logic state diagrams showing the logic state of logic circuits of the converter shown in FIG. 1;

FIG. 6 is a logic state diagram showing the logic state of the input signal level and output of the first logic circuit in the converter shown in FIG. 5;

FIGS. 7A–7D are logic state diagrams showing the logic state of the first and second logic circuit chains when an error occurs in the first logic circuit chain;

FIG. 8 is a logic state diagram showing the logic state of the first and second logic circuit chains;

FIG. 10 is a code diagram for explaining an encoder circuit of the converter shown in FIG. 9; and FIGS. 11A–11E are logic circuit diagrams for explaining the resistance to errors of this invention.

DETAILED DESCRIPTION OF THE INVENTION

Preferred embodiments of this invention are described below while referring to the accompanying drawings.

Figure 5:
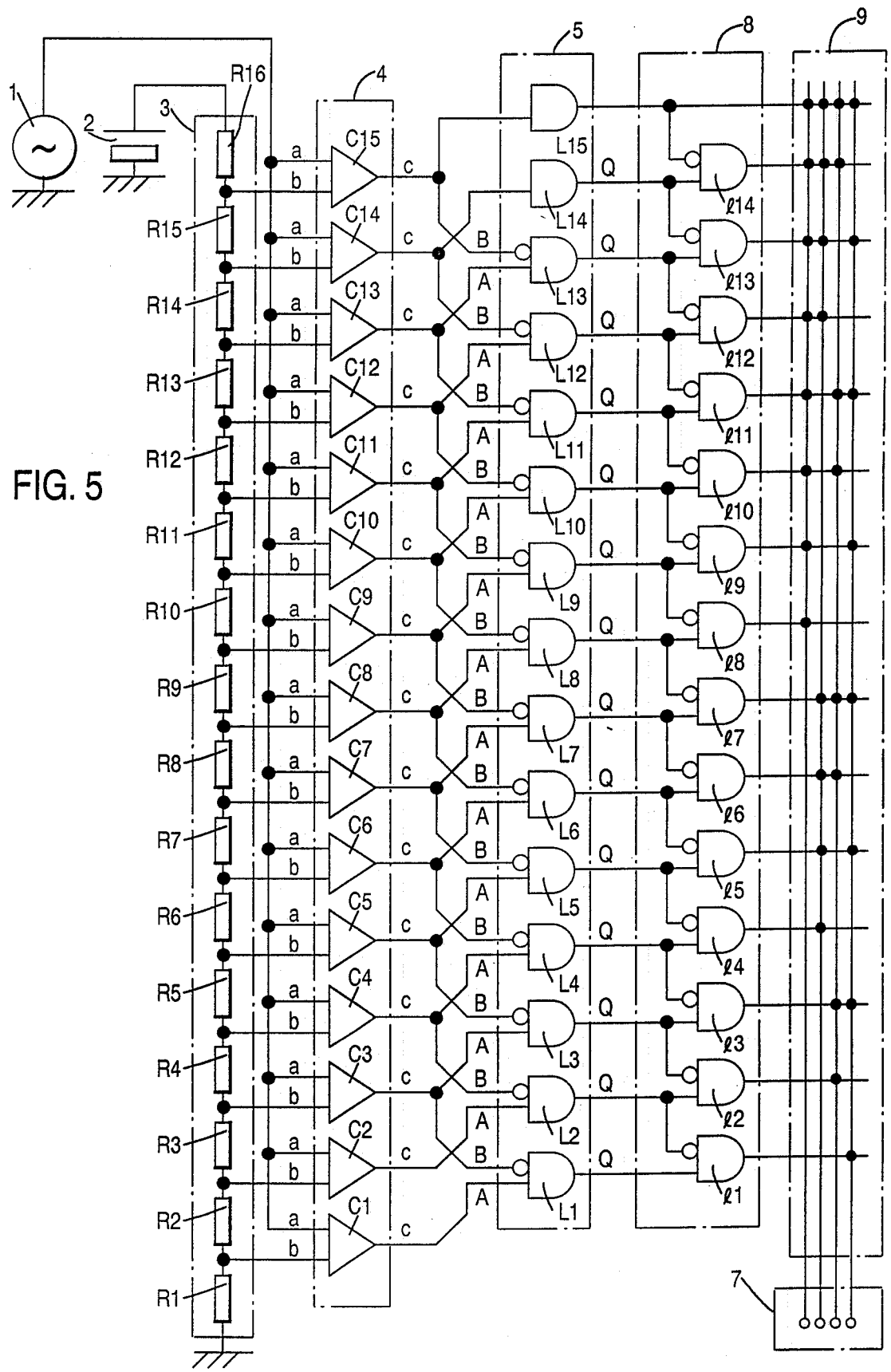
FIG. 5 is a logic circuit diagram of a parallel type A/D converter in a first embodiment of this invention.
Figure 9:
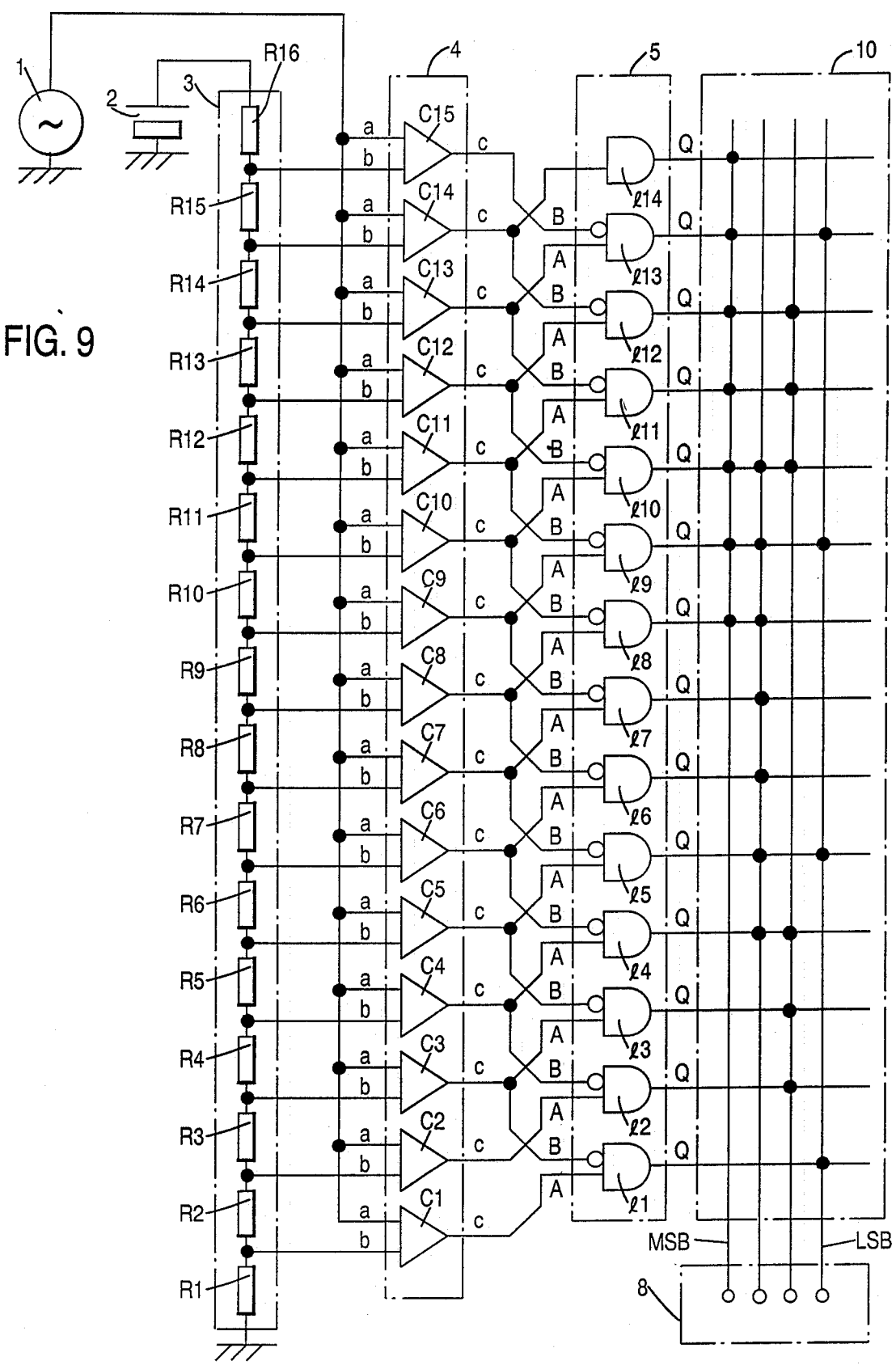
FIG. 9 is a logic circuit diagram of a parallel type A/D converter in a second embodiment of this invention.

FIG. 5 is a logic circuit diagram of a parallel type A/D converter in a first embodiment of this invention, in which numeral 5 denotes a first logic circuit chain, and number i of logic circuit Li denotes an AND circuit for receiving as inputs the comparison output from comparator $C_i$ and the inverted comparison output from comparator $C_{i+2}$. Numeral 8 denotes a second logic circuit chain in which each logic circuit is designed to satisfy the logic formula $$z_i = y_i \cdot \overline{y_{i+1}} \quad (3)$$

in which $y_i$ is the output of first logic circuit $L_i$ and $Z_i$ is the output of second logic circuit $L_i$.

In operation, logic circuit $L_i$ of the first logic circuit chain 5 receives as inputs the comparison output from comparator $C_i$ and comparator $C_{i+2}$. Supposing the reference voltage of the comparator $C_i$ to be $V_{ri}$, the output $y_i$ of logic circuit $L_i$ of the first logic circuit chain 5 becomes 1 when the input voltage $V_{in}$ is as follows:

$$y_i = \text{``1''} : V_{ri} \leq V_{in} < V_{r(i+2)} \quad (4)$$

Similarly, $$y_{i-1} = \text{``1''} : V_{r(i-1)} \leq V_{in} < V_{r(i+1)} \quad (5)$$

Therefore, in the first logic circuit chain, as shown in FIG. 6, the output of two adjacent logic circuits denoted by an even number and odd number becomes 1, taking an input voltage range 2LSB (least significant bit unit).

FIGS. 7A to 7D show the logic state of output y of the first logic circuit chain and output z of the second logic circuit chain in the event of an error. Errors may be classified into four types as shown in FIGS. 7A to 7D. In FIG. 7A, the input voltage is near the reference voltage of the 5th comparator, and the 3rd and 5th logic circuits of the first logic circuit chain have delivered 1 simultaneously. FIG. 7B similarly refers to simultaneous outputs of 0. In these cases, the output of the 4th logic circuit of the first logic circuit chain is a stable 1. In FIG. 7C, the input voltage is near the reference voltage of the 6th comparator, and the 4th and 6th logic circuits of the first logic circuit chain have delivered 1 simultaneously. FIG. 7D similarly refers to simultaneous outputs of 0.

In FIG. 7, the output z of the second logic circuit chain is the logic state in which the logic, is composed to satisfy equation (3). In all the cases shown in FIGS. 7A to 7D, normal values are delivered.

The reason why the logic circuit is effective is explained by referring to FIG. 8.

FIG. 8A shows a logic state in normal conversion corresponding to FIG. 6, FIG. 8B relates to an erroneous state as shown in FIGS. 7A, 7C, and FIG. 8C represents an erroneous state shown in FIGS. 7B, 7D. In these diagrams, $y_i$ is the i-th logic output of the first logic circuit chain, and $z_i$ denotes the i-th logic output of the second logic circuit chain. Considering equation (3), $$z_i = y_i \cdot \overline{y_{i+1}} \quad (3)$$

there is only one $z_i$ which becomes 1 in any of the cases shown in FIG. 7A to 7C. The reason for this is that, whether the first logic circuit chain is in normal conversion state or erroneous state, the logic circuit of any number generates one or more "1" in consecutive numbers at the output y of the first logic circuit chain. This point is an important element in this invention, and in the conventional parallel type A/D converter, multiple generations of data were experienced as shown in FIG. 4B, 4C, or missing of converted value occurred, and these defects have been eliminated in this invention. Meanwhile, the logic structure of the second logic circuit chain 6 is composed as shown in equation (3), but as clear from FIG. 8, it may also be possible to employ the logic formula, $$zi = yi - \overline{1 \cdot yi - 2} \tag{6}$$

Besides, in the encoder circuit 7, binary codes are used in the embodiment, but other codes may be similarly used, such as a Gray code.

As described herein, in the first embodiment of this invention, since one or more logic outputs of the first logic circuit chain generate "1" consecutively, even in an erroneous state, by the first logic circuit chain receiving the comparison outputs of comparator and comparator 1+2 as the inputs, and a proper logic processing corresponding to the nature of the logic input is effected on the second logic circuit chain receiving these logic outputs as the inputs, the intrinsic errors occurring in the conventional parallel type A/D converter can be eliminated, and an almost error-free parallel type A/D converter can be presented, so that it is extremely useful for enhancement of the conversion reliability of parallel type A/D converter and for realization of a high speed conversion apparatus.

Furthermore, as shown in equation (2), the probability of incidence of error increases exponentially as the conversion time t becomes shorter, but in this invention since this error is prevented, if the conversion time t is short, the error incidence is extremely low, and thus contributes greatly to an increase in the speed of the A/D conversion.

A second embodiment of this invention is described hereinafter. This embodiment is intended to realize the functions of the second logic circuit in the first embodiment by a coding circuit composed by a novel coding technique.

The coding circuit in this embodiment, making use of the phenomenon in the first embodiment that in which two adjacent logic outputs of the first logic circuit chain 5 becomes "1" simultaneously, basically codes by making active a pair of encoder inputs, and suppresses the size of error by generating a value extremely close to the normal conversion value even if such errors occur, which one of the encoder inputs is missing or three or more inputs become active simultaneously.

As for coding of the encoder circuit 10, coding of an encoder input of an even number is effected by a Gray code, except and the least significant bit (LSB) is left empty. In coding an encoder input of an odd number, supposing n to be an integer greater than 0, coding of the, encoder input of number $2n+1$ is to operate to obtain an AND of dot of each bit of the coding of the encoder input of number $2n$ and coding of number $2n+2$, moreover, LSB encoder line is dotted in the case of the encoder input $6n+1$ an a Gray code output is obtained consequently, at the output end.

The reason why correct coding conversion is effected in the above constitution is described below.

This coding, based on the Gray code, does not to generate a Gray code at the output by making active one usual encoder input, but to obtains a Gray code by making active a pair of adjacent encoder inputs. The procedure of converting from an ordinary Gray code into the code of this invention is described in FIG. 10.

In the code of this invention, the encoder inputs of numbers j and j−1 are simultaneously made active, and a Gray code in the value of j is obtained. The operation is different depending on whether j is an odd number or an even number as follows.

(1) If an odd number: $j=2n+1$, n: a natural number greater than 0.

Encoder inputs of number $2n+1$ and $2n$ are made active simultaneously, but in the ordinary Gray code in FIG. 10B, the upper bits excluding the least significant bit are quite identical, and since the coding circuit is an OR circuit, the coding of the second bit and over of numbers $2n+1$ and $2n$ may be required only in one side, and the other is unnecessary.

(2) If an even number: $j=2n$

When logic circuits of numbers $2n$ and $2n-1$ become active simultaneously, coding of the upper bits over the second bit is different, but $2n$ is required as the output value.

Considering from cases (1) and (2), as for the coding of upper bits over the second bit, coding of encoder input of an even number is effected in Gray code, and coding of the encoder input of an odd number is not required.

The coding method of the least significant bit is as follows. In the case of an odd number ($j=2n+1$), the encoder inputs of numbers $2n+1$ and $2n$ become active simultaneously, and in the case of an even number ($j=2n$), the encoder inputs of numbers $2n$ and $2n-1$ become active simultaneously, and therefore, sharing the data of number $2n$, it is required that the coding of number $2n+1$ and coding of number $2n-1$ be different from each other. This means that the coding of the least significant bit of number $2n$ is 0 because the encoder circuit is an OR circuit. In order that the coding of number $2n+1$ and the coding of number $2n-1$ be different from each other, number $2n+1$ must be 0 and number $4n-1$ must be 1, or number $4n+1$ must be 1 and number $4n-1$ must be 0, but in the case of Gray code, since number $4n+1$ is 1 and number $4n-1$ is 0, it may be directly used.

The code prepared in such a procedure is indicated as an intermediate code in FIG. 10C. This intermediate code generates a Gray code with respect to a pair of inputs. This intermediate code does not require coding of the 2nd bit and over with respect to an input of an odd number, and furthermore, since the coding of number $2n-1$ is completely unnecessary for all bits, the logic circuit of number $4n-1$ is not needed, and the circuitry is simplified. Moreover, since the number of dots for coding on the encoder is decreased, the load is reduced, and the speed increases.

Figure 1:
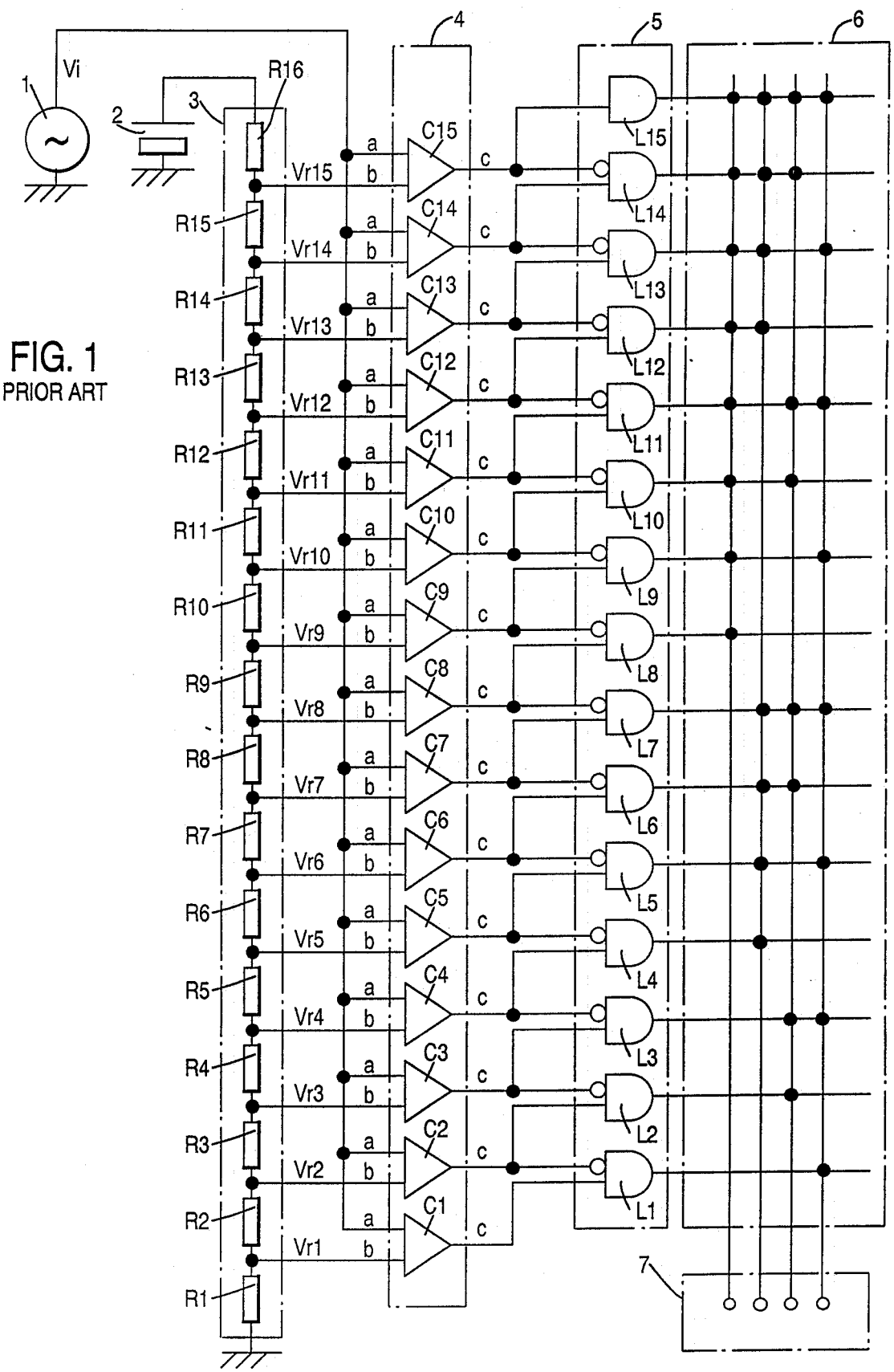
FIG. 1 is a logic circuit diagram of a conventional parallel type A/D converter.
Figure 2:
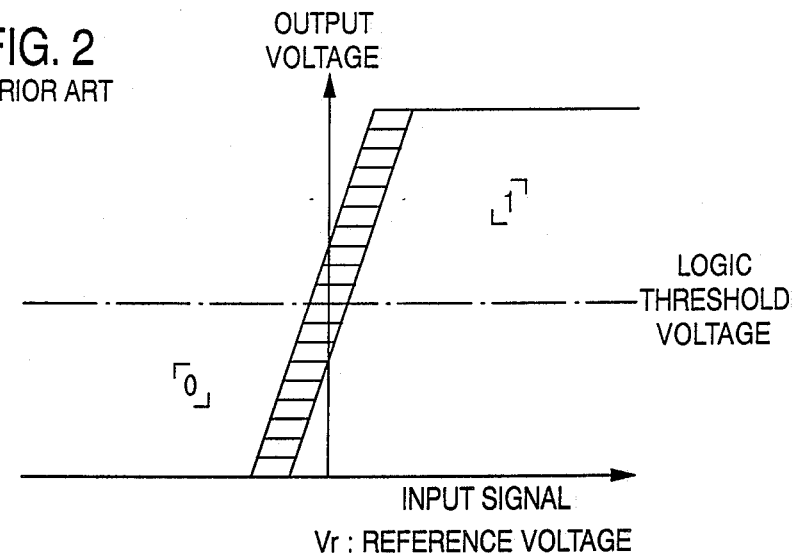
FIG. 2 is a characteristic diagram showing the input and output characteristics of comparator circuits for composing the converter shown in FIG. 1.
Figure 3:
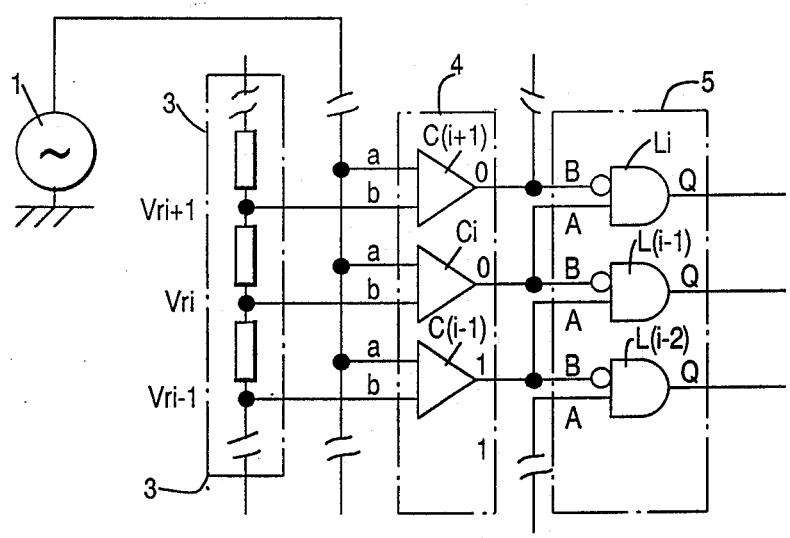
FIG. 3 is a logic circuit diagram showing a portion of the converter shown in FIG. 2.

In this state, however, if an input of an odd number drops out of a pair of inputs, only the least significant bit is generated. To avoid this inconvenience, in the coding of the 2nd bit and over with respect to the logic circuit output at odd number $2n+1$ of the upper bits of the encoder input of odd number, coding is effected by the AND operation in each bit of coding for logic circuit output of number $2n$ and coding for logic circuit output of number $2n+2$. In FIG. 10D, 1* is a bit formed in this manner. For example, as for coding of the output of logic circuit of number 3 (=$2n+1$, n=1), the AND operation is performed in every bit for the codings (0010) and (0110) for the outputs of the 2nd (=$2n$, n=1), and 4th (=$2n+2$, n=1) logic circuits, that is, (001*0).

By coding in this manner, when coding by the output of the logic circuit of number $2n$ and the output of the logic circuit of number $2n+1$, or when encoder inputs of number 2n and number 2n−1 are generated, it is evident that the 1* newly formed in the second embodiment does not cause any inconvenience. Furthermore, according to this embodiment, even if one of the two inputs of the encoder circuit 10 is missing, the other input generates a value very close to the normal value by a function of Gray code, so that it is extremely effective for elimination of data occurring in the conventional parallel type A/D converter as shown in FIG. 5C.

Furthermore, as for multiple generations of data shown in FIG. 4B, the value is extremely close to the normal value due to the nature of Gray code. FIG. 11A shows a normal logic state; and 11B to E shows abnormal logic state, in the logic circuit diagrams to explain the error resistance of this invention. In normal logic state A, the encoder inputs of number 9 and number 10 becomes active, and the encoder output delivers a value of c, resulting from the OR of two codes. In the state B, the number 9 encoder input has dropped out, and in the state C, the number 10 encoder input has dropped out. The output is 1 in the case of B and is 9 in the case of C, and an error of only ±1 LSB is caused. In the state D, the input of number 11 has become active by mistake, and in the state E, the input of number 8 has become active by mistake. In both cases the encoder output is 10 and there is no error. This is only an example of erroneous state, and according to the calculation by the present inventors, in any one of the two error modes shown in FIG. 4B, 4C (multiple generations of data, and dropout of data), the magnitude of error is within ±1 LSB, and the incidence of +1 LBS and −1 LBS is both 25%, and the rate of freedom from error is 50%, so that a parallel type A/D converter with an extremely low incidence rate of errors may be realized.

Incidentally, the second embodiment of this invention, is based on the Gray code, but it is evident that a similar constitution is possible by using a quasi-Gray code which is a modified version of Gray code.

As explained herein, in the second embodiment of this invention, since one or more logic outputs of the first logic circuit chain generates "1" consecutively, even in erroneous state, by the first logic circuit chain receiving the comparison outputs of the number i comparator and number i+2 comparator as the inputs, and the a proper logic processing corresponding to the nature of the logic input is effected on the second logic circuit chain receiving these logic outputs as the inputs, or the encoder circuit is composed for converting the code with respect to a pair of inputs instead of the second logic circuit chain, the intrinsic errors occurring in the conventional parallel type A/D converter can be eliminated, and an almost error-free parallel type A/D converter can be presented, so that it is extremely useful for enhancement of the conversion reliability of parallel type A/D converter and for realization of high speed conversion.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

We claim:
1. A parallel type A/D converter comprising:
a means for generating plural reference voltages;
a comparator chain comprising plural comparator means for comparing said reference voltages with an input voltage;
a first logic train comprising a first set of plural logic means for generating a pair of logic outputs each being one of a first and second logic state and having as inputs the outputs from said comparator chain; and
a second logic train comprising a second set of plural logic means for generating one of a logic output state and a set of coded output states and having as inputs the pair of logic outputs of said plural logic means of said first logic train.

2. A parallel type A/D converter comprising:
a means for generating at least N reference voltages, wherein N is a positive integer;
a comparator chain comprising N comparator means, the n-th comparator means for comparing a voltage value of an input signal and the n-th reference voltage, and for outputting a logic signal in accordance with the thus compared voltage value of the input signal and n-th reference voltage, wherein n is a positive integer from 1 to N; and
a first logic chain comprising N first logic circuits, the n-th first logic circuit having as inputs the logic signal output from the n-th comparator means and the logic signal output from the (n+2)th comparator means.

3. A converter as recited in claim 2, further comprising:
a second logic chain comprising N second logic circuits, the n-th second logic circuit having an inputs as output from the n-th first logic circuit and an output from the (n+1)th first logic circuit.

4. A converter as recited in claim 2, wherein the n-th first logic circuit includes means for generating an output $Y_n$, wherein $Y_n = C_n \cdot \overline{C_{n+2}}$, and wherein $C_n$ is the logic signal output from the n-th comparator and $C_{n+2}$ is the logic signal output from the (n+2)th comparator.

5. A converter as recited in claim 3, wherein the n-th first logic circuit includes means for generating an output $Y_n$, wherein $Y_n = C_n \cdot \overline{C_{n+2}}$, and wherein $C_n$ is the logic signal output from the n-th comparator and $C_{n+2}$ is the logic signal output from the (n+2)th comparator.

6. A converter as recited in claim 3, wherein the n-th second logic circuit includes means for generating an output $Z_n$, wherein $Z_n = Y_n \cdot \overline{Y_{n+1}}$, and wherein $Y_n$ is a logic signal output from the n-th first logic circuit and $Y_{n+1}$ is a logic signal output from the (n+1)th first logic circuit.

7. A converter as recited in claim 5, wherein the n-th second logic circuit includes means for generating an output $Z_n$, wherein $Z_n = Y_n \cdot \overline{Y_{n+1}}$, and wherein $Y_n$ is a logic signal output from the n-th first logic circuit and $Y_{n+1}$ is a logic signal output from the (n+1)th first logic circuit.

8. A converter as recited in claim 2 further comprising: an encoder circuit having as inputs logic signal outputs from the N first logic circuit and generating a coded signal.

9. A converter as recited in claim 8, wherein the coded signal is a binary Gray code signal having M bits, wherein M is an integer and wherein $M^2 = N+1$, and wherein the encoder circuit comprises M bit lines for generating the Gray code signal having M bits.

10. A converter as recited in claim 9, wherein a is an even number from 2 to N, and wherein the 1st bit line outputs a least significant bit of the coded signal and the M-th bit line outputs a most significant bit of the coded signal, and wherein the a-th input from the N first logic circuits is connected to the 2nd through M-th bit lines in accordance with Gray code, and wherein the (a+1)th input from the N first logic signals is connected to the 2nd through M-th bit lines in accordance with an AND operation of the a-th and the (a+2)th connection of each of the 2nd through M-th bit lines, and wherein the first input from the N first logic signals and every M-th input thereafter is connected to the 1st bit line.

* * * * *